(12) United States Patent
Elferich et al.

(10) Patent No.: US 12,302,463 B2
(45) Date of Patent: May 13, 2025

(54) COLOR TUNABLE LASER BASED SOURCE

(71) Applicant: SIGNIFY HOLDING B.V., Eindhoven (NL)

(72) Inventors: Reinhold Elferich, Aachen (DE); Dominique Maria Bruls, Heeze (NL); Robert Van Asselt, Valkenswaard (NL); Olexandr Valentynovych Vdovin, Maarheeze (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 136 days.

(21) Appl. No.: 18/019,517

(22) PCT Filed: Jul. 20, 2021

(86) PCT No.: PCT/EP2021/070265
§ 371 (c)(1),
(2) Date: Feb. 3, 2023

(87) PCT Pub. No.: WO2022/028881
PCT Pub. Date: Feb. 10, 2022

(65) Prior Publication Data
US 2023/0292416 A1     Sep. 14, 2023

(30) Foreign Application Priority Data
Aug. 6, 2020   (EP) ..................................... 20189870

(51) Int. Cl.
*H05B 45/20* (2020.01)
*H01S 5/042* (2006.01)
*H01S 5/062* (2006.01)

(52) U.S. Cl.
CPC ........... *H05B 45/20* (2020.01); *H01S 5/0428* (2013.01); *H01S 5/06216* (2013.01)

(58) Field of Classification Search
CPC ... H05B 45/20; H01S 5/0428; H01S 5/06216; F21V 9/30; F21V 23/003; F21K 9/00
See application file for complete search history.

(56) References Cited

U.S. PATENT DOCUMENTS 8,125,157 B2 * 2/2012 Ronda ................... H01L 33/502
315/246
8,552,659 B2 * 10/2013 Ashdown ............... H05B 45/22
315/312

(Continued)

FOREIGN PATENT DOCUMENTS

KR       20140123788 A       10/2014

*Primary Examiner* — Lincoln D Donovan
*Assistant Examiner* — James G Yeaman

(57) ABSTRACT

Disclosed is a light generating system including a light source, a luminescent material, and a control system, the light source is configured in an operational mode to generate pulsed light source light having a pulse frequency and a duty cycle, the luminescent material is configured to convert part of the light source light into luminescent material light, wherein the luminescent material light has a luminescence decay time, the light generating system is configured in the operational mode to generate system light comprising light source light and the luminescent material light; the system light has a variable color point and the control system is configured in the operational mode to control the color point by controlling one or more of the pulse frequency and the duty cycle.

16 Claims, 5 Drawing Sheets

(56) References Cited

U.S. PATENT DOCUMENTS

| | | |
|---|---|---|
| 2006/0114201 A1 | 6/2006 | Chang |
| 2010/0109541 A1* | 5/2010 | Roberts .................. H05B 45/10 315/224 |
| 2016/0372639 A1 | 12/2016 | Mueller et al. |
| 2020/0037409 A1 | 1/2020 | Peeters et al. |

* cited by examiner

COLOR TUNABLE LASER BASED SOURCE

CROSS-REFERENCE TO PRIOR APPLICATIONS

This application is the U.S. National Phase application under 35 U.S.C. § 371 of International Application No. PCT/EP2021/070265, filed on Jul. 20, 2021, which claims the benefit of European Patent application Ser. No. 20/189,870.7, filed on Aug. 6, 2020. These applications are hereby incorporated by reference herein.

FIELD OF THE INVENTION

The invention relates to a light generating system and to a light generating device comprising such light generating system.

BACKGROUND OF THE INVENTION

Color control of light sources employing phosphors is known in the art. US2010/0109541, for instance, describes an illumination apparatus comprising: a light source comprising a lighting device which emits light and a phosphor material which converts at least a portion of the light emitted by the lighting device to light of a different wavelength; and a controller which adjusts a ratio of current on time to current off time of a current waveform supplied to the lighting device whereby a contribution of light emitted by the phosphor to a color of the light emitted by the light source is modified. The lighting device comprises a solid state lighting device.

SUMMARY OF THE INVENTION

In general, in white LEDs, a yellow (and sometimes additionally a red) phosphor is excited by a blue LED die that lies below the phosphor in the LED package. As not all the blue light is converted during this process, part of the blue light will be mixed with the converted yellow light, thus resulting in a white light source. The resulting color temperature depends on the ratio of the converted light and the non-converted blue light. In LEDs, in general, this ratio is fixed, and is difficult to dynamically change in a controlled way.

Hence, it is an aspect of the invention to provide an alternative light generating system, which preferably further at least partly obviates one or more of above-described drawbacks. The present invention may have as object to overcome or ameliorate at least one of the disadvantages of the prior art, or to provide a useful alternative.

It appears that when e.g. a blue laser is used to pump a yellow emitting phosphor, the color of white light created by the blue laser source and the yellow phosphor can be modified by means of very high frequency pulse width modulation, something that may not be possible when LED dies are used, as their switching frequency is limited. It appears that when the laser diode current is switched at period a few times the luminescence decay time the ratio of the blue to the luminescent radiation can be altered by the duty cycle. While the primary radiation behaves proportional to the duty cycle the secondary radiation is kept in an early decay process and thus rather high. This effect can e.g. be used to lower the blue component at a relatively flat level of yellow emission which means shifting the CCT from cold to warm white. Given an average luminescence decay time e.g. for Ce-doped YAG phosphor of 30 to 60 ns, modulation switching frequencies of 0.5-100 MHz may be useful, like about 1-50 MHz, e.g. with slope rates of a few ns, such as equal to or less than about 5 ns, like equal to or less than about 2 ns.

Hence, in a first aspect the invention provides a light generating system ("system") comprising a light source (especially a laser light source), a luminescent material, and a control system. Especially, the light source is configured in an operational mode to generate pulsed light source light having a pulse frequency $f_{per}$ and a duty cycle d. Further, especially the luminescent material is configured to convert (at least) part of the light source light into luminescent material light. The luminescent material light has a luminescence decay time $\tau_L$ (herein also indicated as "decay time"). Especially, in embodiments the light generating system is configured in the operational mode to generate system light comprising light source light and the luminescent material light. Especially, (thereby) the system light may have a variable color point. Especially, the control system is configured in the operational mode to control the color point, especially by controlling one or more of the pulse frequency $f_{per}$ and the duty cycle d. In further specific embodiments, $f_{per} \geq 1/(10*\tau_L)$. Especially, the duty cycle is equal to or smaller than 0.95. Hence, especially in embodiments the invention provides a light generating system comprising a light source, a luminescent material, and a control system, wherein: (I) the light source is configured in an operational mode to generate pulsed light source light having a pulse frequency $f_{per}$ and a duty cycle d; (II) the luminescent material is configured to convert part of the light source light into luminescent material light, wherein the luminescent material light has a decay time TL; (III) the light generating system is configured in the operational mode to generate system light comprising light source light and the luminescent material light; wherein the system light has a variable color point; and (IV) the control system is configured in the operational mode to control the color point by controlling one or more of the pulse frequency $f_{per}$ and the duty cycle d, wherein $f_{per} \geq 1/(10*\tau_L)$. In yet a further aspect, the invention provides a light generating system comprising a light source, a luminescent material, and a control system, wherein: (I) the light source is configured in an operational mode to generate pulsed light source light having a pulse period $T_{per}$ and a duty cycle d; (II) the luminescent material is configured to convert part of the light source light into luminescent material light, wherein the luminescent material light has a decay time $\tau_L$; (III) the light generating system is configured in the operational mode to generate system light comprising light source light and the luminescent material light; wherein the system light has a variable color point; and (IV) the control system is configured in the operational mode to control the color point by controlling one or more of the pulse period $T_{per}$ and the duty cycle d, wherein $T_{per} \leq 10*\tau_L$, and wherein in specific embodiments $T_{per} \geq 1.4*\tau_L$, such as $T_{per} \geq 2*\tau L$.

With such light generating system, it may be possible to vary the ratio of luminescent material light and light source light. In a relatively simple way, the color point of the resulting light may be controlled. For instance, in embodiments the correlated color temperature (CCT) may be controlled in this way. Further, this allows a very simple and small device, with potentially very high intensities, of which the color point may be controlled. Hence, amongst others the present invention provides a color tunable laser-based source, especially a color tunable white laser-based source. Amongst others, with the invention a (single source) (very high) frequency modulated color tunable white laser-based source for e.g. general illumination is provided.

As indicated above, the light generating system comprises a light source, a luminescent material, and a control system. Other elements may also be available. Here below, the light source, the luminescent material, and the control system are discussed.

As indicated above, the light source is configured in an operational mode to generate pulsed light source light. The term light source may in principle relate to any light source known in the art. It may be a conventional (tungsten) light bulb, a low pressure mercury lamp, a high pressure mercury lamp, a fluorescent lamp, a LED (light emissive diode). Preferably, the light source is a light source that during operation emits at least light at wavelength selected from the range of 380-450 nm. This light may partially be used by the light conversion element (see below). In a specific embodiment, the light source comprises a solid state LED light source (such as a LED or laser diode). The term "light source" may also relate to a plurality of light sources, such as 2-200 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of light semiconductor light source may be configured on the same substrate. In embodiments, a COB is a multi LED chip configured together as a single lighting module.

The light source has a light escape surface. Referring to conventional light sources such as light bulbs or fluorescent lamps, it may be outer surface of the glass or quartz envelope. For LED's it may for instance be the LED die, or when a resin is applied to the LED die, the outer surface of the resin. In principle, it may also be the terminal end of a fiber. The term escape surface especially relates to that part of the light source, where the light actually leaves or escapes from the light source. The light source is configured to provide a beam of light. This beam of light (thus) escapes form the light exit surface of the light source.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module.

The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs).

In embodiments, the light source may comprise a LED with on-chip optics. In embodiments, the light source comprises a pixelated single LEDs (with or without optics) (offering in embodiments on-chip beam steering).

The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser. Hence, in embodiments the light source comprises a laser light source.

In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride ($Sm:CaF_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate $Nd:YCa_4O(BO_3)_3$ or Nd:YCOB, neodymium doped yttrium orthovanadate ($Nd:YVO_4$) laser, neodymium glass (Nd: glass) laser, neodymium YLF (Nd:YLF) solid-state laser, promethium 147 doped phosphate glass ($147Pm^{3+}$:glass) solid-state laser, ruby laser ($Al_2O_3:Cr^{3+}$), thulium YAG (Tm:YAG) laser, titanium sapphire (Ti:sapphire; $Al_2O_3$: $Ti^{3+}$) laser, trivalent uranium doped calcium fluoride ($U:CaF_2$) solid-state laser, Ytterbium doped glass laser (rod, plate/chip, and fiber), Ytterbium YAG (Yb:YAG) laser, $Yb_2O_3$ (glass or ceramics) laser, etc.

In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

A laser may be combined with an upconverter in order to arrive at shorter (laser) wavelengths. For instance, with some (trivalent) rare earth ions upconversion may be obtained or with non-linear crystals upconversion can be obtained. Alternatively, a laser can be combined with a downconverter, such as a dye laser, to arrive at longer (laser) wavelengths.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light. The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments≤2° (FWHM), more especially≤1° (FWHM), most especially≤0.5° (FWHM). Hence, ≤2° (FWHM) may be considered (highly) collimated light source light. Optics may be used to provide (high) collimation (see also above).

In specific embodiments, the light generating system may comprise a plurality of different light sources, such as two or more subsets of light sources, with each subset comprising one or more light sources configured to generate light source light having essentially the same spectral power distribution, but wherein light sources of different subsets are configured to generate light source light having different spectral distributions. In such embodiments, a control system may be configured to control the plurality of light sources. In specific embodiments, the control system may control the subsets of light sources individually.

Especially, the light source comprises a solid state light source. In yet further specific embodiments, the light source comprises a laser. In yet further specific embodiments, the light source comprises a laser diode.

Especially, the light source is configured to generate pulsed light source light having a pulse frequency $f_{per}$ and a duty cycle d. Further, the light source is especially configured in the operational mode to generate pulsed light source light having a pulse period $T_{per}$. Pulsed light sources, such as pulsed solid state lasers, are known in the art. For instance, nanosecond or picosecond laser diodes are known in the art. It is for instance referred to e.g. US20170085057A1 or U.S. Pat. No. 7,723,642B2. Especially, the pulse frequency $f_{per}$ and a duty cycle d are controllable. Aspects in relation to $f_{per}$, duty cycle d, and a pulse period $T_{per}$ are further described below.

The light generating system further comprises a luminescent material. Especially, the luminescent material is configured to convert at least part of the light source light into luminescent material light. Hence, part of the light source light may not be converted and may be transmitted and/or reflected and/or scattered at the luminescent material, and may at least partly be reused. The luminescent material may be configured in the reflective mode or transmissive mode.

The luminescent material is configured downstream of the light source. The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream". Further, the luminescent material and the light source may thus be radiationally coupled. The terms "radiationally coupled" or "optically coupled" may especially mean that (i) a light generating element, such as a light source, and (ii) another item or material, are associated with each other so that at least part of the radiation emitted by the light generating element is received by the item or material. In other words, the item or material is configured in a light-receiving relationship with the light generating element. At least part of the radiation of the light generating element will be received by the item or material. This may in embodiments be directly, such as the item or material in physical contact with the (light emitting surface of the) light generating element. This may in embodiments be via a medium, like air, a gas, or a liquid or solid light guiding material. In embodiments, also one or more optics, like a lens, a reflector, an optical filter, may be configured in the optical path between light generating element and item or material.

The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion. In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex}<\lambda_{em}$), though in specific embodiments the luminescent material may comprise up-converter luminescent material, i.e. radiation of a larger wavelength is converted into radiation with a smaller wavelength ($\lambda_{ex}>\lambda_{em}$).

In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials. Examples of possible luminescent materials are indicated below.

In embodiments, luminescent materials are selected from garnets and nitrides, especially doped with trivalent cerium or divalent europium, respectively. The term "nitride" may also refer to oxynitride or nitridosilicate, etc.

In specific embodiments the luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A'_{x2}Ce_{x3})_3(Al_{y1-y2}B'_{y2})_5O_{12}$, wherein $x1+x2+x3=1$, wherein $x3>0$, wherein $0<x2+x3\leq0.2$, wherein $y1+y2=1$, wherein $0\leq y2\leq0.2$, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially $x1>0$, such as $>0.2$, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the first light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein $0<x2+x3\leq0.1$, and wherein $0\leq y2\leq0.1$. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein $x1+x3=1$, and wherein $0<x3\leq0.2$, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein $x1+x2+x3=1$, wherein $x3>0$, wherein $0<x2+x3\leq0.2$, wherein $y1+y2=1$, wherein $0\leq y2\leq0.2$. Especially, x3 is selected from the range of 0.001-0.1. Note that in embodiments $x2=0$. Alternatively or additionally, in embodiments $y2=0$.

In specific embodiments, A may especially comprise at least Y, and B may especially comprise at least Al.

In embodiments, the luminescent material may alternatively or additionally comprise one or more of $M_2Si_5N_8$:$Eu^{2+}$ and/or $MAlSiN_3$:$Eu^{2+}$ and/or $Ca_2AlSi_3O_2N_5$:$Eu^{2+}$, etc., wherein M comprises one or more of Ba, Sr and Ca, especially in embodiments at least Sr. Hence, in embodiments, the luminescent may comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba,Sr,Ca)_2Si_5N_8$:Eu can also be indicated as $M_2Si_5N_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8$:Eu (i.e. 75% Ba; 25% Sr). Here, Eu is introduced and replaces at least part of M, i.e. one or more of Ba, Sr, and Ca). Likewise, the material $(Ba,Sr,Ca)AlSiN_3$:Eu can also be indicated as $MAlSiN_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art.

In embodiments, a red luminescent material may comprise one or more materials selected from the group consisting of $(Ba,Sr,Ca)S$:Eu, $(Ba,Sr,Ca)AlSiN_3$:Eu and $(Ba,Sr,Ca)_2Si_5N_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in $CaAlSiN_3$:Eu, the correct formula could be $(Ca_{0.98}Eu_{0.02})AlSiN_3$. Divalent europium will in general replace divalent cations, such as the above divalent alkaline earth cations, especially Ca, Sr or Ba.

The material $(Ba,Sr,Ca)S$:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material $(Ba,Sr,Ca)_2Si_5N_8$:Eu can also be indicated as $M_2Si_5N_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8$:Eu (i.e. 75% Ba; 25% Sr). Here, Eu is introduced and replaces at least part of M, i.e. one or more of Ba, Sr, and Ca).

Likewise, the material $(Ba,Sr,Ca)AlSiN_3$:Eu can also be indicated as $MAlSiN_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Eu in the above indicated luminescent materials is substantially or only in the divalent state, as is known to the person skilled in the art.

Blue luminescent materials may comprise YSO ($Y_2SiO_5$:$Ce^{3+}$), or similar compounds, or BAM ($BaMgAl_{10}O_{17}$:$Eu^{2+}$), or similar compounds.

The term "luminescent material" herein especially relates to inorganic luminescent materials, which are also sometimes indicated as phosphors. These terms are known to the person skilled in the art.

Alternatively or additionally, also other luminescent materials may be applied. For instance quantum dots and/or organic dyes may be applied and may optionally be embedded in transmissive matrices like e.g. polymers, like PMMA, or polysiloxanes, etc. etc.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nano-wires, etcetera.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Different luminescent materials may have different spectral power distributions of the respective luminescent material light. Alternatively or additionally, such different luminescent materials may especially have different color points (or dominant wavelengths).

As indicated above, other luminescent materials may also be possible. Hence, in specific embodiments the luminescent material is selected from the group of divalent europium containing nitrides, divalent europium containing oxynitrides, divalent europium containing silicates, cerium comprising garnets, and quantum structures. Quantum structures may e.g. comprise quantum dots or quantum rods (or other quantum type particles) (see above). Quantum structures may also comprise quantum wells. Quantum structures may also comprise photonic crystals.

Especially, the luminescent material comprises an inorganic luminescent material. The luminescent material light has a (luminescent) decay time τL. Would a material have more than a single decay time, the term "decay time" may especially refer to a first order decay kinetics having a single (dominant or average or typical) decay (life) time. Herein, the decay time may in embodiments especially not refer to afterglow effects (but may in embodiments especially refer to pure f-f or f-d transitions of rare earth ions). For the decay time, the standard definition $S=S0*\exp(-t/\tau_L)$, is applied, i.e. the time in which the intensity has dropped to 1/e of the initial intensity at t=0.

Yet further, the luminescent material may especially be $Ce^{3+}$ and/or $Eu^{2+}$ based, such as the above described trivalent cerium comprising garnet, which may have decay times in the order of about 5-100 nanosecond, or such as the above described divalent europium based nitrides or oxynitrides, which may have decay times in the order of microsecond. The decay times may depend upon the host material (i.e. the material wherein $Ce^{3+}$ or $Eu^{2+}$ is doped (is available as "dopant" or "activator").

As indicated above, the light generating system is configured in the operational mode to generate system light comprising light source light and the luminescent material light. Hence, system light emanating away from the system may comprise the light source light and the luminescent material light. For instance, the system may comprise an end window (from light transmissive material) via which the system light may escape from the system. The system may further comprise optics, as will be clear to a person skilled in the art.

The system light may in embodiments comprise visible light. Alternatively or additionally, the system light may comprise UV radiation or IR radiation. The terms "visible", "visible light" or "visible emission" and similar terms refer to light having one or more wavelengths in the range of about 380-780 nm. Herein, UV may especially refer to a wavelength selected from the range of 200-380 nm. The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light. The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The term "cyan" may refer to one or more wavelengths selected from the range of about 490-520 nm. The term "amber" may refer to one or more wavelengths selected from the range of about 585-605 nm, such as about 590-600 nm. Herein, UV (ultraviolet) may especially refer to a wavelength selected from the range of 200-380 nm, though in specific embodiments other wavelengths may also be possible. Herein, IR (infrared) may especially refer to radiation having a wavelength selected from the range of 780-3000 nm, such as 780-2000-nm, e.g. a wavelength up to about 1500 nm, like a wavelength of at least 900 nm, though in specific embodiments other wavelengths may also be possible. Hence, the term IR may herein refer to one or more of near infrared (NIR (or IR-A)) and short-wavelength infrared (SWIR (or IR-B)), especially NIR.

Especially, the system light comprises, or essentially consist of visible light.

In embodiments, the system light has a variable color point. This may especially be due to varying one or more of pulse frequency, pulse time, and duty cycle. Hence, different colors (of system light) may be generated. In specific embodiments, colors or color points of a first type of light and a second type of light may be different when the respective color points of the first type of light and the second type of light differ with at least 0.01 for u' and/or with at least 0.01 for v', even more especially at least 0.02 for u' and/or with at least 0.02 for v'. In yet more specific embodiments, the respective color points of first type of light and the second type of light may differ with at least 0.03 for u' and/or with at least 0.03 for v'. Here, u' and v' are color coordinate of the light in the CIE 1976 UCS (uniform chromaticity scale) diagram.

As indicated above, the control system may be configured in the operational mode to control the color point by controlling one or more of the pulse frequency $f_{per}$ and the duty cycle d. Alternatively or additionally, the control system may be configured in the operational mode to control the color point by controlling one or more of the pulse frequency period $T_{per}$ and the duty cycle d. In specific embodiments, $f_{per} \geq 1/(10*\tau_L)$. Alternatively or additionally, in specific embodiments $T_{per} \leq 10*\tau_L$. Smaller values for $f_{per}$ and/or larger values for $T_{per}$ may have no specific impact on the color point, in the sense that a further decrease or increase, respectively, may essentially have no impact on the color point.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or I-phone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme. The sensor signal is the sensor signal of a sensor. The term "sensor" may also refer to a plurality of (different) sensors. The sensor may in embodiments comprise one or more sensors selected from the group of an ambient light sensor (e.g. for sensing light in a space, such as a room), outdoor light sensor, temperature sensor, proximity sensor, movement sensor, etc.

Especially, in embodiments $f_{per} \leq 1/(\tau_L)$. Alternatively or additionally, in embodiments $T_{per} \geq *\tau_L$. It appears that at frequencies of $f_{per} \geq 1/(\tau_L)$, such as already at frequencies $f_{per} \geq 1/(2*\tau_L)$, the complexity of the system may increase whereas very good results may be obtained with frequencies $f_{per} \leq 1/(2*\tau_L)$. Likewise, it appears that at pulse times of $T_{per} \leq \tau_L$, even more especially already at pulse times $T_{per} \leq 2*\tau_L$, the complexity of the system may increase whereas very good results may be obtained with pulse times $T_{per} \geq 2*\tau_L$.

To give an example, when the decay time is 50 ns, then $1/(\tau_L)=20$ MHz, $1/(2*\tau_L)=10$ MHz, and $1/(10*\tau_L)$, is 2 MHz.

In embodiments, the duty cycle d complies with d<1, especially d≤0.95, such as d≤0.8. In yet more specific embodiments, d≤0.75, like in embodiments d≤0.6, even more especially d≤0.5.

In more specific embodiments, the control system is configured in the operational mode to control the color point by controlling the pulse frequency $f_{per}$ in the range of $1/(8*\tau_L)$ to $1/(1.4*\tau_L)$, such as especially in the range of $1/(8*\tau_L)$ to $1/(2*\tau_L)$. Hence, in embodiments $f_{per} \leq 1/(1.4*\tau_L)$.

As indicated above, in embodiments one may vary the color point by varying the pulse frequency or pulse period. Alternatively or additionally, in embodiments, one may vary the color point by varying the duty cycle.

In specific embodiments, the control system may be configured in the operational mode to control the color point by controlling the pulse frequency $f_{per}$ at constant duty cycle d. Especially, in embodiments d≤0.5. Larger duty cycles may have less effect on the color point. Especially, in embodiments the duty cycle d is selected from the range of 0.01-0.5. such as 0.02-0.5, such as selected from the range of 0.05-0.4, like 0.1-0.25. Especially, the duty cycle is at least 0.01. Note that the duty cycle may be controlled (and may thus vary over time).

In specific embodiments, the control system may be configured in the operational mode to control the color point by controlling the duty cycle d at constant pulse frequency $f_{per}$. Especially, in embodiments the control system may be configured in the operational mode to control the color point by controlling the duty cycle d between 0.02-0.5 at constant pulse frequency wherein $f_{per} \leq 1/(2*\tau_L)$.

Rise times and fall times may especially be essentially less than the decay time, like≤0.5*$\tau_L$, but in general especially≤0.2*$\tau_L$, such as ≤0.1*$\tau_L$.

Would e.g. be the light source light be blue light and the luminescent material light be yellow light, then the system light may in embodiments be white light. Other embodiments, however, may also be possible. When in the operational mode the system light is white light, it may be possible in embodiments to tune the CCT. Hence, in specific embodiments the light generating system may be configured in the operational mode to generate white system light having a correlated color temperature, wherein the control system may be configured in the operational mode to control the correlated color temperature by controlling one or more of the pulse frequency $f_{per}$ and the duty cycle d.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

As indicated above, in embodiments the luminescent material comprises a luminescent material of the type $A_3B_5O_{12}$:Ce, wherein A comprises one or more of Y, La, Gd, Tb and Lu, and wherein B comprises one or more of Al, Ga, In and Sc. Yet further, especially in embodiments the light source may be configured in an operational mode to generate blue pulsed light source light. Further, as indicated above in specific embodiments the light source comprises a laser diode.

It may be desirable to further add a color to the system light. In embodiments, this may be solid state light source light, such as laser diode light, (directly) admixed in the system light. Via pulse width modulation, the relative contribution to the system light may be controlled (by the control system). Alternatively or additionally, in embodiments this may also be luminescent material light (of a second luminescent material). In such embodiments, it may be desirable to pump the second luminescent material with another light source (second light source), though this is not necessarily the case. For instance, it may be useful as in general the decay times will be different. Would such second luminescent material be pumped via a second light source, via pulse width modulation the relative contribution to the system light may be controlled (by the control system). In specific embodiment, this may be executed via the same principle as described herein in relation to the first light source (light) and first luminescent material (light).

Hence, in specific embodiments the invention also provides the light generating system as defined herein, also comprising a second light source and a second luminescent material, wherein: (I) the second light source is configured in an operational mode to generate pulsed second light source light having a second pulse frequency $f_{per2}$ and a second duty cycle d2; (II) the second luminescent material is configured to convert part of the second light source light into second luminescent material light, wherein the second luminescent material light has a decay time $\tau_{L2}$; (III) the light generating system is configured in the operational mode to generate system light comprising the light source light, the luminescent material light, the second luminescent material light and optionally the second light source light; wherein the system light has a variable color point; and (IV) the control system is configured in the operational mode to control the color point by controlling one or more of the pulse frequency $f_{per}$ and the duty cycle d and optionally one or more of second pulse frequency $f_{per2}$ and the second duty cycle d2. In specific embodiments, also $f_{per2} \geq 1/(10^*\tau_{L2})$ and/or $f_{per2} \leq 1/(1.4^*\tau_{L2})$, especially $f_{per2} \geq 1/(8^*\tau_{L2})$ and/or $f_{per2} \leq 1/(2^*\tau_{L2})$. However, other embodiments, in relation to the pulse frequency or pulse time and duty cycle, etc. may also be possible. For instance, in embodiments the second light source is not necessarily a pulsed light source.

Especially, the first light source light and second light source light have different color points. Further, especially the first luminescent material light and second luminescent material have different color points. For instance, the second luminescent material light may be orange or red light. Hence, in specific embodiments the second luminescent material is configured to convert part of the second light source light into red second luminescent material light. Also in this way, a color tunable system may be provided.

The second light source may in embodiments also be used as such, without a conversion material. Hence, in yet a further embodiment, the invention also provides the light generating system as defined herein, comprising a second light source wherein the second light source is configured in an operational mode to generate pulsed second light source light, wherein the light generating system is configured in the operational mode to generate system light comprising the light source light, the luminescent material light, and the second light source light; wherein the system light has a variable color point; and the control system is configured in the operational mode to control the color point by controlling the second light source (in addition to controlling the first light source, see also above). The second light source may comprise a laser light source. A non-limiting number of embodiments of light sources are described above. Especially, the first light source light and second light source light have different color points. The second light source may be CW or pulsed. In specific embodiments, the light generating system is configured in the operational mode to generate white system light comprising the light source light, the luminescent material light, and the second light source light. The second light source light may e.g. be red light, though other embodiments may also be possible. Also in this way, a color tunable system may be provided.

In yet a further aspect, the invention provides a light generating device selected from the group of a lamp, a luminaire, and a projector device, comprising the light generating system as defined herein. Yet further, in embodiments the light generating device may be a spot light having a variable correlated color temperature, wherein the correlated color temperature is variable over a range of at least 1000 K, such as at least 1500 K. For instance, the range of at least 1000 K may be selected within the range of 1800-6500 K, such as in the range of 2000-6500 K, such as e.g. a range of 2000-3500 K, or a range of 3500-6000 K, etc. The luminaire may further comprise a housing, optical elements, louvres, etc. etc. . . . . . The lamp or luminaire may further comprise a housing enclosing the light generating system. The lamp or luminaire may comprise a light window in the housing or a housing opening, through which the system light may escape from the housing. Note that the control system may also be partly or completely external of the lamp, luminaire or projector device, such as external of the lamp or luminaire.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting. The lighting device (or luminaire) may be part of or may be applied in e.g. optical communication systems or disinfection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

The present invention proposes amongst others in embodiments a light source with adjustable CCT made of a relatively simple configuration; i.e., one laser source and one phosphor. The CCT may in embodiments be adjusted in an open loop manner because the employed effect is stable over temperature (i.e. the difference between rise and decay time of the phosphor's luminescence) and uses physical constants as input control parameters. Also, the laser diode current modulation/timing can be made sufficiently accurate. In this way, a feed-forward system can be employed in order to control the CCT of the light emitted by the system. In embodiments, the envisaged lamp may use a single laser diode source only, which may be modulated at frequencies in the range of 0.5-100 MHz, such as 1-50 MHz, e.g. dependent upon the luminescent material. This modulated laser light may in embodiment be used to excite Ce-doped YAG phosphors that have typical decay times of 10-100 ns. By choosing the proper modulation frequency, duty cycle and phosphor with a specific decay time, open-loop CCT control can be achieved. For composing the white light one phosphor material is used to create a (yellow) secondary converted radiation together with the direct blue spectrum of the primary radiation. The ratio of the primary (blue) radiation with respect to the secondary (yellow) can be altered by means of reducing the duty cycle. This operation mode can e.g. be used simultaneously to lower CCT and brightness, e.g. to mimic the dimming behavior of a halogen spot. In a second operation mode, the frequency may be varied at a given duty cycle (such as below 0.5) resulting in a reduced ratio of the primary radiation at increased frequencies. In a third operation mode both duty cycle and frequency modulation may be mixed e.g. to keep the total luminous flux constant while shifting the CCT from cold to warm-yet keeping the pulse amplitude unchanged.

Figure 1:
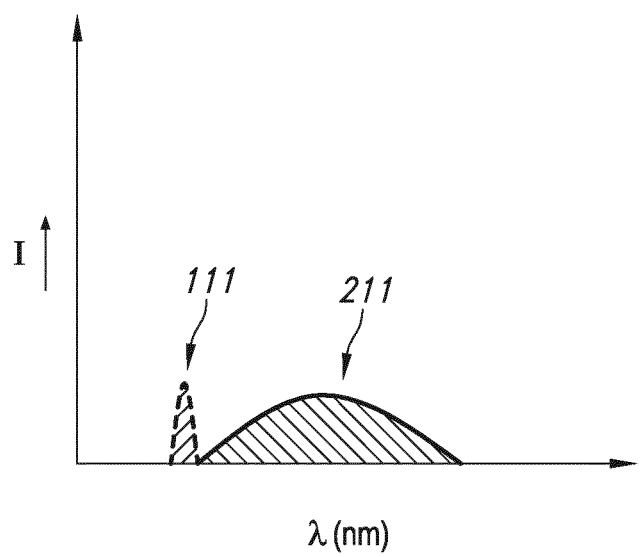
FIG. 1 schematically provides an illustration of primary radiation (light source) and secondary emission (luminescent material light) spectrum to be mixed.

FIG. 1 schematically depicts the two kinds of visible radiation; namely firstly the part of the blue laser emission that is not absorbed by the phosphor and secondly its luminescent emission.

Figure 2:
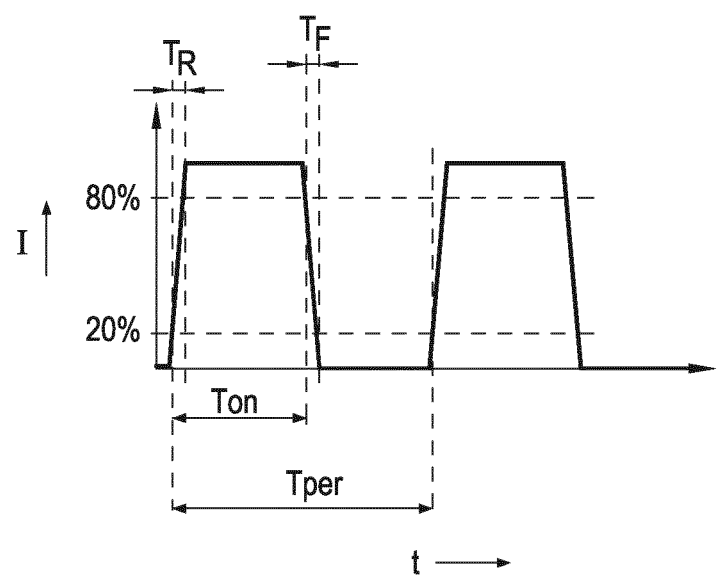
FIG. 2 shows an example current waveform and definition of rise time TR and duty cycle d=Ton/$T_{per}$. TF is the fall time (which may be about the same as TR)

Assuming a laser driving current (y-axis: I for current) pattern as shown in FIG. 2 with switching periods close to the luminescence lifetime ($\tau_L$) and transition times (Tr) well below $\tau_L$, the relative content of secondary (converted, luminescent) radiation with respect to the total radiation can be varied as plotted in FIG. 3 (see also table below). The family of curves refer to fixed frequencies while the duty cycle is varied. The frequencies fs=1/$T_{per}$ are related to the luminescence lifetime ($\tau_L$). The higher the frequency the more the effect is pronounced. For example, at $\tau_L$=60 ns the lower curve refers fs=⅕$\tau_L$=3.3 MHz. Reference $T_{per}$ indicates the pulse period or pulse time.

Figure 3:
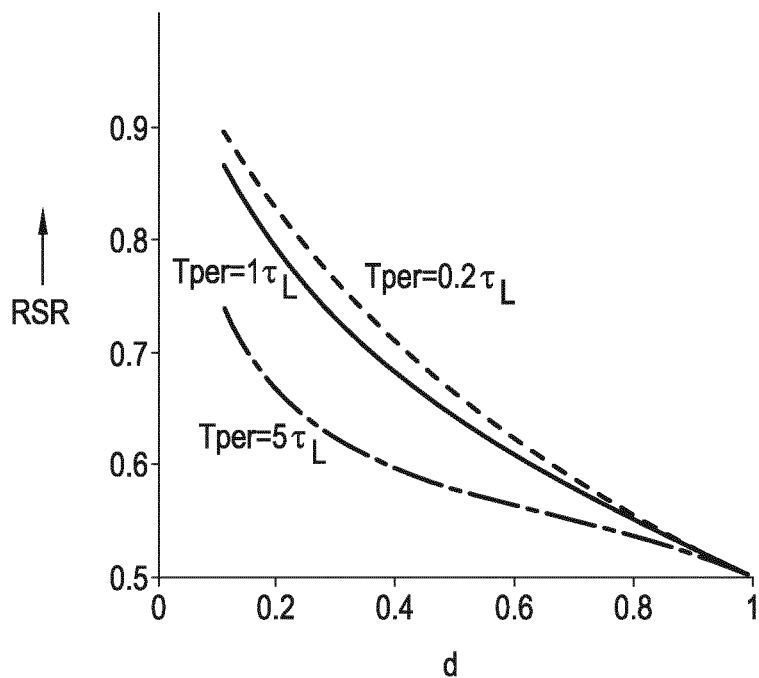
FIG. 3 shows the fraction of secondary radiation (luminescence) with respect to the total radiation as a function of duty cycle (d). Calculation example with 50% secondary radiation at direct current (i.e., without modulation). The parameter is the ratio of the switching period of the laser diode current to the luminescence decay time ($T_{per}$). On the y-axis RSR is indicates, which refers to the relative secondary radiation (or relative secondary emission, relative to the total radiation)
Figure 4:
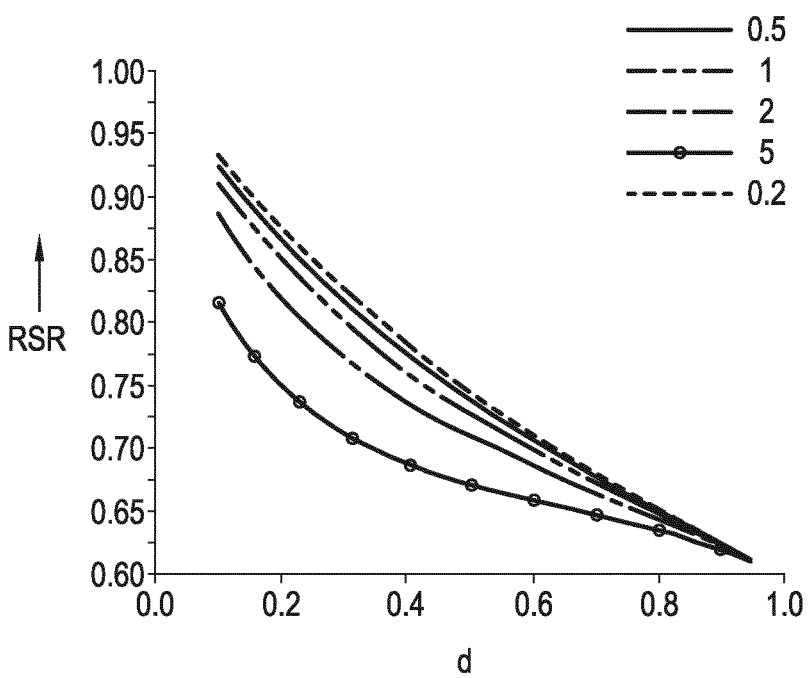
FIG. 4 is a similar plot as FIG. 3 showing again the secondary radiation related to the total radiation as function of duty cycle for various switching period times. Here however, the starting point at DC operation (i.e., CW) is set to 0.61 resulting in 10000K CCT. The parameter of the family of curves again is the switching period time (related to the decay time $\tau_L$)

FIG. 4 shows a similar plot as FIG. 3 showing again the secondary radiation related to the total radiation as function of duty cycle for various period times (between 0.2*$\tau_L$ and 5*$\tau_L$). Here however, the starting point at DC operation (i.e., CW) is set to 0.61 resulting in 10000K CCT. The parameter of the family of curves again is the period time (related to the decay time $\tau_L$).

Figure 5:
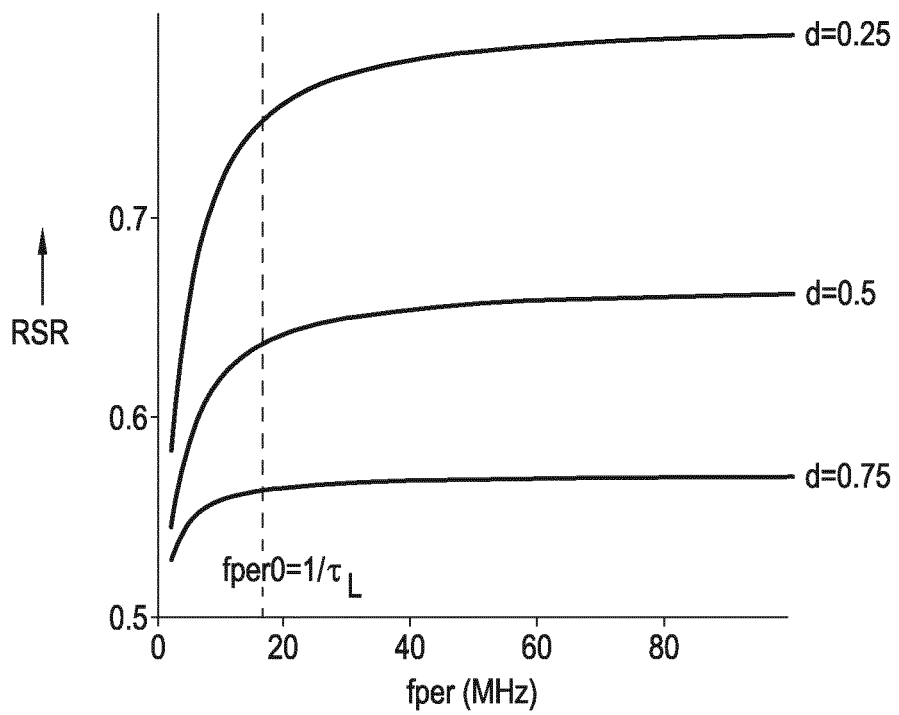
FIG. 5 shows fraction of secondary radiation (luminescence) with respect to the total radiation as function of frequency with the duty cycle (d) is varied.

The red shift can as well be achieved by keeping the duty cycle constant while varying the frequency; FIG. 5 shows that lower duty cycles can give a stronger CCT variation if only the diode can be operated at sufficiently high frequencies. The duty cycle is varied between 0.75 and 0.25 in this example.

Figure 6A:
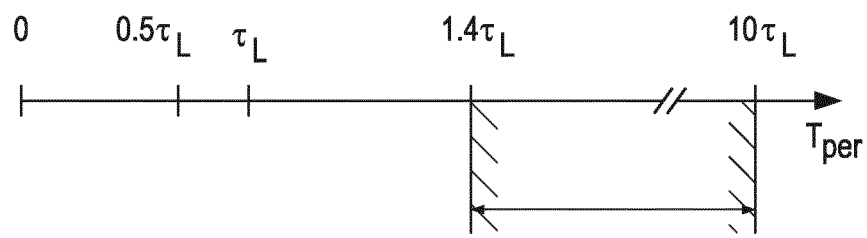
FIGS. 6a-6b schematically depict some aspects in relation to pulse period and pulse frequency.
Figure 6B:
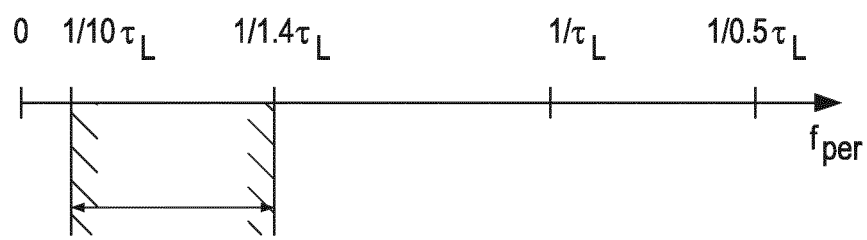

FIGS. 6a and 6b schematically depict relevant ranges for the pulse period $T_{per}$ and frequency $f_{per}$, respectively.

Varying either modulation frequency or duty cycle at a time results in a variation of the total radiation. A color shift can be achieved while generating roughly a constant output flux if the driving frequency and duty cycle are modified simultaneously. The examples describe the situation for a single conversion phosphor, but can also be applied to combinations of multiple phosphors, excited by a single laser or by multiple lasers.

Figure 7A:
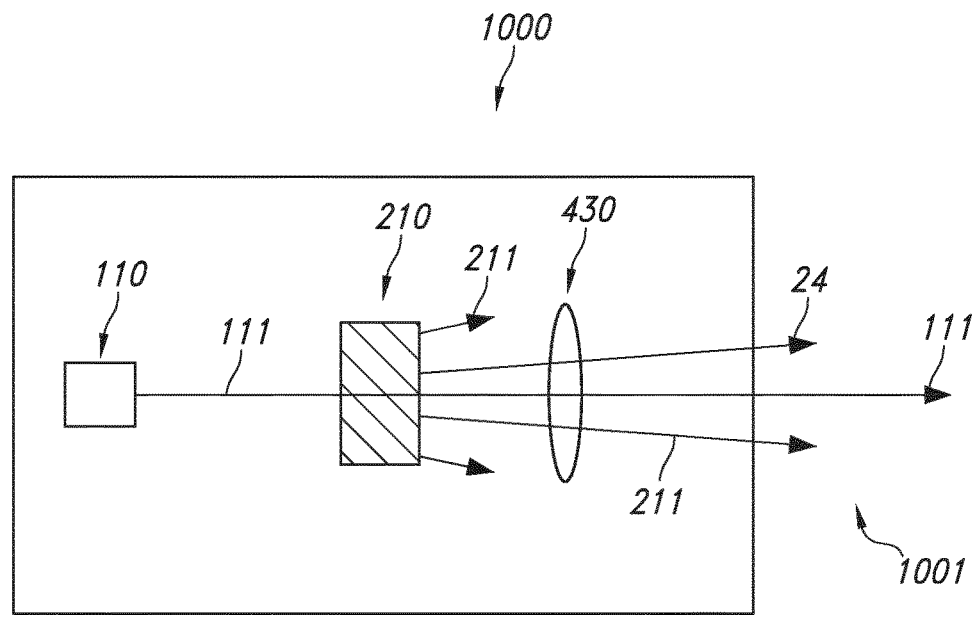
FIGS. 7a-7b schematically depicts some embodiments.

Also more than one laser type can be used in a system (e.g. blue laser to excite yellow phosphor and green laser for excitation of red phosphor). In this case broader color space tuneability can be achieved. Referring to FIG. 7a, the invention provides amongst others a light generating system 1000 comprising a light source 110, a luminescent material 210, and a control system 300. The light source 110 may be configured in an operational mode to generate pulsed light source light 111 having a pulse frequency $f_{per}$ and a duty cycle d. Further, the luminescent material 210 is configured to convert part of the light source light 111 into luminescent material light 211, wherein the luminescent material light 211 has a decay time $\tau_L$. Especially, the light generating system 1000 is configured in the operational mode to generate system light 1001 comprising light source light 111 and the luminescent material light 211; wherein the system light 1001 has a variable color point. Further, the control system 300 is configured in the operational mode to control the color point by controlling one or more of the pulse frequency $f_{per}$ and the duty cycle d, wherein $f_{per} \geq 1/(10*\tau_L)$. Especially, in embodiments $f_{per} \leq 1/(\tau_L)$.

The control system 300 may be configured in the operational mode to control the color point by controlling the pulse frequency $f_{per}$ at constant duty cycle d. Especially, the control system 300 may be configured in the operational mode to control the color point by controlling the pulse frequency $f_{per}$ in the range of $1/(8*\tau_L)-1/(2*\tau_L)$. For instance, in embodiments d≤0.5. Yet further, in embodiments, the duty cycle d is selected from the range of 0.05-0.5. In embodiments, the control system 300 may be configured in the operational mode to control the color point by controlling the duty cycle d at constant pulse frequency $f_{per}$. Especially, the control system 300 may be configured in the operational mode to control the color point by controlling the duty cycle d between 0.05-0.5 at constant pulse frequency wherein $f_{per} \leq 1/(2*\tau_L)$.

As indicated above, the light generating system 1000 is configured in the operational mode to generate white system light 1001 having a correlated color temperature, wherein the control system 300 may be configured in the operational mode to control the correlated color temperature by controlling one or more of the pulse frequency $f_{per}$ and the duty cycle d.

The luminescent material 210 may comprise a luminescent material of the type $A_3B_5O_{12}$:Ce, wherein A comprises one or more of Y, La, Gd, Tb and Lu, and wherein B comprises one or more of Al, Ga, In and Sc, wherein the light source 110 is configured in an operational mode to generate blue pulsed light source light 111, and wherein the light source 110 comprises a laser diode.

Reference 430 refers to an optional optical component, like a beam shaping element, a collimator, a lens, a reflector, etc.

Figure 7B:
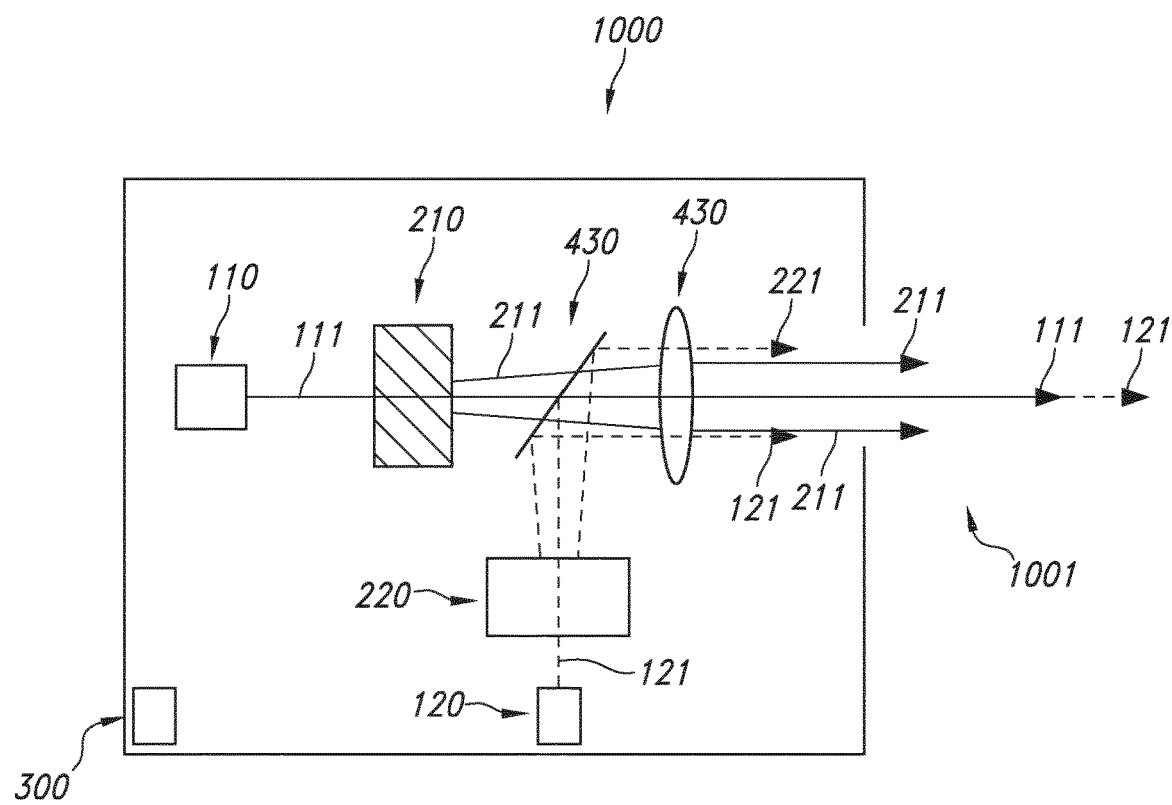

As schematically depicted in FIG. 7b, the light generating system 1000 may further comprise a second light source 120 and a second luminescent material 220. The second light source 120 may be configured in an operational mode to generate pulsed second light source light 121 having a second pulse frequency $f_{per2}$ and a second duty cycle d2. The second luminescent material 220 may be configured to convert part of the second light source light 121 into second luminescent material light 221, wherein the second luminescent material light 221 has a decay time $\tau_{L2}$. Especially, the light generating system 1000 may be configured in the operational mode to generate system light 1001 comprising the light source light 111, the luminescent material light 211, the second luminescent material light 221 and optionally the second light source light 121; wherein the system light 1001 has a variable color point. Further, in embodiments the control system 300 may especially be configured in the operational mode to control the color point by controlling one or more of the pulse frequency $f_{per}$ and the duty cycle d and optionally one or more of second pulse frequency $f_{per2}$ and the second duty cycle d2. For instance, $f_{per2} \geq 1/(10*\tau_{L2})$. In embodiments, the second luminescent material 220 is configured to convert part of the second light source light 121 into red second luminescent material light 221. References 430 refer to an optional optical component, like a beam shaping element, a collimator, a lens, a beam combiner (like a dichroic beam combiner), etc. Here, in FIG. 7b a dichroic beam combiner and a lens are used as optics 430, though also other optics may be applied. The dichroic beam combiner is used to combine the second luminescent material light 221 with the first luminescent material light.

Other embodiments, however, may also be possible, such as with only a second light source 120, especially comprising a laser light source. Such light source may in embodiments be configured parallel to the first light source 110, especially when the luminescent material 210 is transmissive for the second light source light 121. This may e.g. be the case when the first light source 110 is configured to generate blue first light source, light, the second light source 120 is configured to generate red second light source light 121, and the luminescent material 210 is configured to convert at least part of the first light source light 111 into yellow luminescent material light 211.

Figure 8:
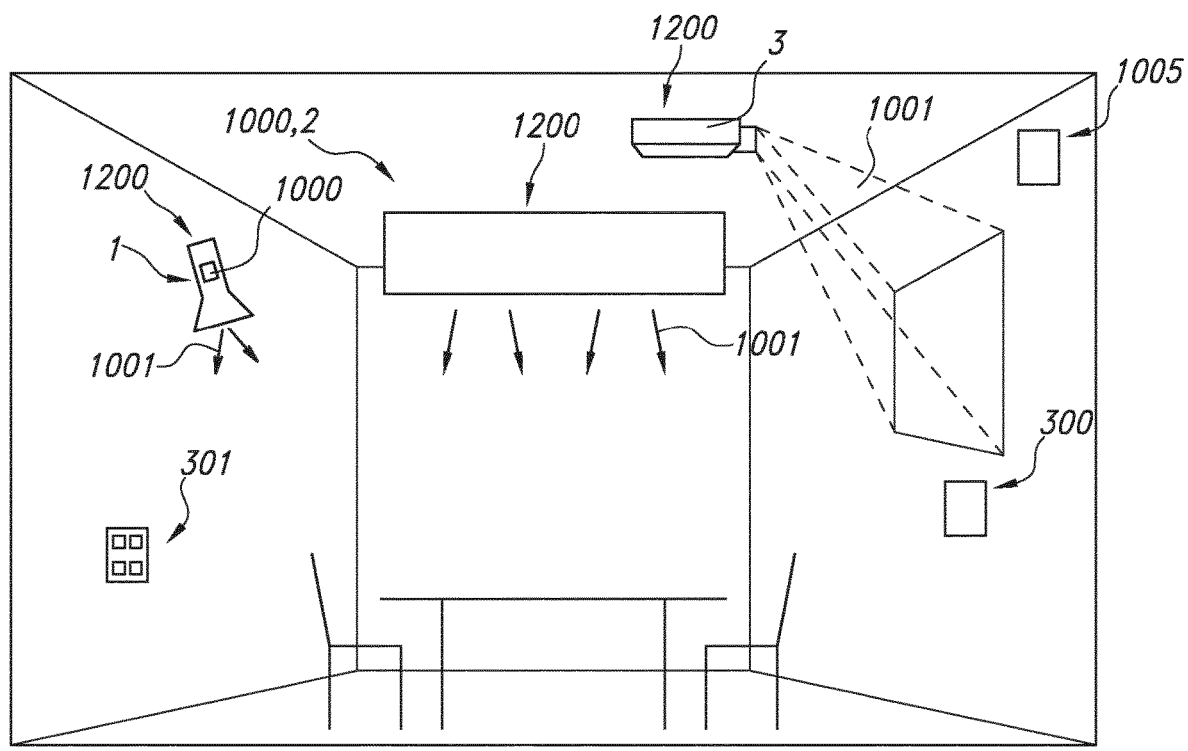
FIG. 8 schematically depict some applications.

As indicated above, the control system 300 is configured in the operational mode to control the color point in dependence of an input signal of a user interface, a sensor signal of a sensor, and a timer, see also FIG. 8.

FIG. 8 schematically depicts embodiments of a light generating device 1200, such as selected from the group of a lamp 1, a luminaire 2, and a projector device 3. The light generating device 1200 may comprise the light generating system 1000 as defined herein. For instance, the light generating device 1200 may be a spot light having a variable correlated color temperature, wherein the correlated color temperature is variable over a range of at least 1000 K. Reference 1005 indicates a sensor.

As can be seen from FIGS. 3-5, the color temperatures of resulting spectral compositions can be varied in the wide range. The lowest value of a relative fraction of converted radiation in the integral spectrum is determined by the spectral composition in the DC operation mode, and the highest would depend on duty cycle and modulation frequency, but can approach values of 0.9. Taking as an example a system with a laser diode emitting at 460 nm and a Gd-doped YAG phosphor converter material an accessible color tuneability range can be calculated. The results are shown in the table below. Depending on the driving parameters, the resulting color point can be tuned in the range from 10000K to 4300K and below. The color points are not following the BBL line and deviating significantly from the black body curve at CCTs of 5500K and below, which is a result of a single phosphor system. In order to have white-tunable source in a broader range a two-phosphor system would be desired.

| CCT, K | Duv | Yellow/Total |
|---|---|---|
| 10000 | −0.006 | 0.61 |
| 9000 | −0.004 | 0.63 |
| 7970 | −0.002 | 0.65 |
| 7000 | 0.002 | 0.68 |
| 5500 | 0.013 | 0.76 |
| 4500 | 0.030 | 0.87 |
| 4300 | 0.036 | 0.90 |

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" also includes embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A light generating system comprising a light source, a luminescent material, and a control system, wherein:
   the light source is configured in an operational mode to generate pulsed light source light having a pulse frequency $f_{per}$ and a duty cycle d;
   the luminescent material is configured to convert part of the light source light into luminescent material light, wherein the luminescent material light has a luminescence decay time $\tau_L$;
   the light generating system is configured in the operational mode to generate system light comprising light source light and the luminescent material light; wherein the system light has a variable color point; and
   the control system is configured in the operational mode to control the color point by simultaneously controlling the pulse frequency $f_{per}$ and the duty cycle d, wherein $f_{per} \geq 1/(10*\tau_L)$.

2. The light generating system according to claim 1, wherein $f_{per} \leq 1/(1.4\tau_L)$.

3. The light generating system according to claim 1, wherein the control system is configured in the operational mode to control the color point by controlling the pulse frequency $f_{per}$ at constant duty cycle d.

4. The light generating system according to claim 3, wherein the control system is configured in the operational mode to control the color point by controlling the pulse frequency $f_{per}$ in the range of $1/(8*\tau_L)$ to $1/(1.4*\tau_L)$.

5. The light generating system according to claim 3, wherein d≤0.5.

6. The light generating system according to claim 3, wherein the duty cycle d is selected from the range of 0.02-0.5.

7. The light generating system according to claim 1, the control system is configured in the operational mode to control the color point by controlling the duty cycle d at constant pulse frequency $f_{per}$.

8. The light generating system according to claim 7, wherein the control system is configured in the operational mode to control the color point by controlling the duty cycle d between 0.05-0.5 at constant pulse frequency wherein $f_{per} \leq 1/(2*\tau_L)$.

9. The light generating system according to claim 1, wherein the light generating system is configured in the operational mode to generate white system light having a correlated color temperature, wherein the control system is configured in the operational mode to control the correlated color temperature by controlling one or more of the pulse frequency $f_{per}$ and the duty cycle d.

10. The light generating system according to claim 1, wherein the luminescent material comprises a luminescent material of the type $A_3B_5O_{12}$:Ce, wherein A comprises one or more of Y, La, Gd, Tb and Lu, and wherein B comprises one or more of Al, Ga, In and Sc, wherein the light source is configured in an operational mode to generate blue pulsed light source light, and wherein the light source comprises a laser diode.

11. The light generating system according to claim 1, comprising a second light source and a second luminescent material, wherein:
   the second light source is configured in an operational mode to generate pulsed second light source light having a second pulse frequency $f_{per2}$ and a second duty cycle d2;
   the second luminescent material is configured to convert part of the second light source light into second luminescent material light, wherein the second luminescent material light has a luminescence decay time $\tau_{L2}$;
   the light generating system is configured in the operational mode to generate system light comprising the light source light, the luminescent material light, the second luminescent material light and the second light source light; wherein the system light has a variable color point; and
   the control system is configured in the operational mode to control the color point by controlling one or more of the pulse frequency $f_{per}$ and the duty cycle d and one or more of second pulse frequency $f_{per2}$ and the second duty cycle d2.

12. The light generating system according to claim 11, wherein the second luminescent material is configured to convert part of the second light source light into red second luminescent material light.

13. The light generating system according to claim 1, wherein the control system is configured in the operational mode to control the color point in dependence of an input signal of a user interface, a sensor signal of a sensor, and a timer.

14. A light generating device selected from the group of a lamp, a luminaire, and a projector device, comprising the light generating system according to claim 1.

15. The light generating device according to claim 14, wherein the light generating device is a spot light having a variable correlated color temperature, wherein the correlated color temperature is variable over a range of at least 1000 K.

16. The light generating system according to claim 1, wherein the light generating system is configured to enable a color shift while generating substantially constant output flux when the frequency and duty cycle are modified simultaneously.

* * * * *